United States Patent
Chen et al.

(10) Patent No.: US 8,341,494 B2
(45) Date of Patent: Dec. 25, 2012

(54) DECODING APPARATUS FOR HIGH-DENSITY RECORDING MEDIUM

(75) Inventors: Yi-Kai Chen, Hsinchu County (TW); Sih-Kai Wang, Tainan (TW); Sun-How Jiang, Hsinchu (TW)

(73) Assignee: Sunplus Technology Co., Ltd., Hsinchu (TW)

(*) Notice: Subject to any disclaimer, the term of this patent is extended or adjusted under 35 U.S.C. 154(b) by 919 days.

(21) Appl. No.: 12/426,290

(22) Filed: Apr. 20, 2009

(65) Prior Publication Data

US 2010/0064202 A1 Mar. 11, 2010

(30) Foreign Application Priority Data

Sep. 11, 2008 (TW) .............................. 97134830 A

(51) Int. Cl.
*H03M 13/00* (2006.01)
(52) U.S. Cl. ...................................... 714/762; 714/752
(58) Field of Classification Search .................. 714/762, 714/752
See application file for complete search history.

(56) References Cited

U.S. PATENT DOCUMENTS

| | | | |
|---|---|---|---|
| 7,055,082 B2* | 5/2006 | Mori et al. ..................... | 714/768 |
| 7,281,193 B2 | 10/2007 | Wu et al. | |
| 7,340,663 B2* | 3/2008 | Van Dijk et al. .............. | 714/755 |
| 7,555,698 B2* | 6/2009 | Lin ................................. | 714/762 |
| 2005/0163004 A1* | 7/2005 | Suzuki ........................ | 369/47.22 |
| 2006/0069979 A1* | 3/2006 | Wu et al. ........................ | 714/758 |
| 2007/0079214 A1* | 4/2007 | Kim .............................. | 714/762 |
| 2008/0155377 A1* | 6/2008 | Chao et al. ..................... | 714/762 |
| 2010/0180177 A1* | 7/2010 | Wang ............................ | 714/752 |

* cited by examiner

*Primary Examiner* — Yolanda L Wilson
(74) *Attorney, Agent, or Firm* — Jianq Chyun IP Office

(57) ABSTRACT

A decoding apparatus for a high-density recording medium includes a demodulator, a long-distance code (LDC) processing module, a burst indicator subcode (BIS) processing module, an erasure code generator, and a decoder. The demodulator demodulates data from a high-density recording medium to obtain a demodulated data and a demodulation error flag. The LDC processing module and the BIS processing module deinterleave the demodulated data to respectively obtain an LDC data and a BIS data. The erasure code generator sets an erasure flag corresponding to the LDC data according to the demodulation error flag and the BIS error flag. The decoder decodes the LDC data according to the erasure flag. Further, the decoder decodes the BIS data to obtain the BIS error flag.

14 Claims, 6 Drawing Sheets

| | LDC1 | BISF1 | LDC2 | BISF2 | LDC3 | BISF3 | LDC4 |
|---|---|---|---|---|---|---|---|
| Strategy 1 | | 1 | E E | 1 | | | |
| Strategy 2 | | | E E | 1 | E E | | |
| Strategy 3 | E E | | eeeeeeee | 1 | E E | | |
| Strategy 4 | E E | 1 | eeeeeeee | 1 | E E | | |
| Strategy 5 | | | eeeeeeee | 1 | E E | 1 | eeeeeeee |

FIG. 6

DECODING APPARATUS FOR HIGH-DENSITY RECORDING MEDIUM

CROSS-REFERENCE TO RELATED APPLICATION

This application claims the priority benefit of Taiwan application serial no. 97134830, filed Sep. 11, 2008. The entirety of the above-mentioned patent application is hereby incorporated by reference herein and made a part of specification.

BACKGROUND OF THE INVENTION

1. Field of the Invention

The present invention generally relates to a high-density recording medium apparatus, in particular, to a decoding apparatus for a high-density recording medium.

2. Description of Related Art

With the advent of the information age and progress in electronic technologies, high-density recording media capable of storing a large amount of data emerge as required, varying from hard disk (HD), compact disc (CD), digital versatile disc (DVD) to the recently most highlighted blu-ray disc (BD). The BD is read and written through a blue laser beam with a wavelength of 405 nm, so as to effectively raise the density of the stored data, thereby increasing the recording capacity thereof.

Regarding a data decoding apparatus of the BD, referring to FIG. 1, a conventional data decoding apparatus for a high-density recording medium is shown. The data decoding apparatus for a high-density recording medium 100 stores a burst indicator subcode (BIS) and a long-distance code (LDC) obtained through the demodulation and deinterleaving respectively performed by a demodulator 110 and a deinterleaver 120 in a dynamic random access memory (DRAM) 130. A decoder 140 reads the BIS from the DRAM 130, decodes the BIS, and records a BIS error flag in a static random access memory (SRAM) 150 after the decoding. Next, the decoder 140 reads the LDC from the DRAM 130 and decodes the LDC. Meanwhile, an erasure code generator 160 reads the BIS error flag from the SRAM 150, and accordingly generates an erasure flag to the decoder 140 for being used in decoding the LDC.

However, as the deinterleaved BIS is discontinuous, the demodulated and the deinterleaved BIS is stored in the DRAM 130, and is again read from the DRAM 130 to be decoded, such that the decoding is ineffective and takes up the bandwidth of the DRAM 130.

SUMMARY OF THE INVENTION

Accordingly, the present invention is directed to a decoding apparatus for a high-density recording medium, capable of simultaneously deinterleaving a long-distance code (LDC) data and a burst indicator subcode (BIS) data, thereby achieving a better efficiency.

A decoding apparatus for a high-density recording medium includes a demodulator, an LDC processing module, a BIS processing module, an erasure code generator, and a decoder. The demodulator receives and demodulates a data from the high-density recording medium, so as to obtain a demodulated data and a demodulation error flag. The LDC processing module is coupled to the demodulator, for deinterleaving the demodulated data to obtain an LDC data. The BIS processing module is coupled to the demodulator, for deinterleaving the demodulated data to obtain a BIS data, and storing the BIS data and a BIS error flag. The erasure code generator is coupled to the LDC processing module and the BIS processing module, for setting an erasure flag corresponding to the LDC data according to the demodulation error flag and the BIS error flag. The decoder is coupled to the LDC processing module, the BIS processing module, and the erasure code generator, for decoding the LDC data according to the erasure flag, and decoding the BIS data to obtain the BIS error flag.

In the present invention, the LDC data and BIS data are simultaneously deinterleaved, so as to effectively shorten the time taken for deinterleaving the BIS data, thus improving the decoding efficiency of the LDC data. In addition, in the present invention, the erasure flag is set according to the BIS error flag and the demodulation error flag, such that the setting is more precise.

In order to make the aforementioned objectives, features, and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6 is a schematic view showing several strategies of setting an erasure flag by an erasure code generator according to an embodiment of the present invention.

DESCRIPTION OF THE EMBODIMENTS

Figure 1:
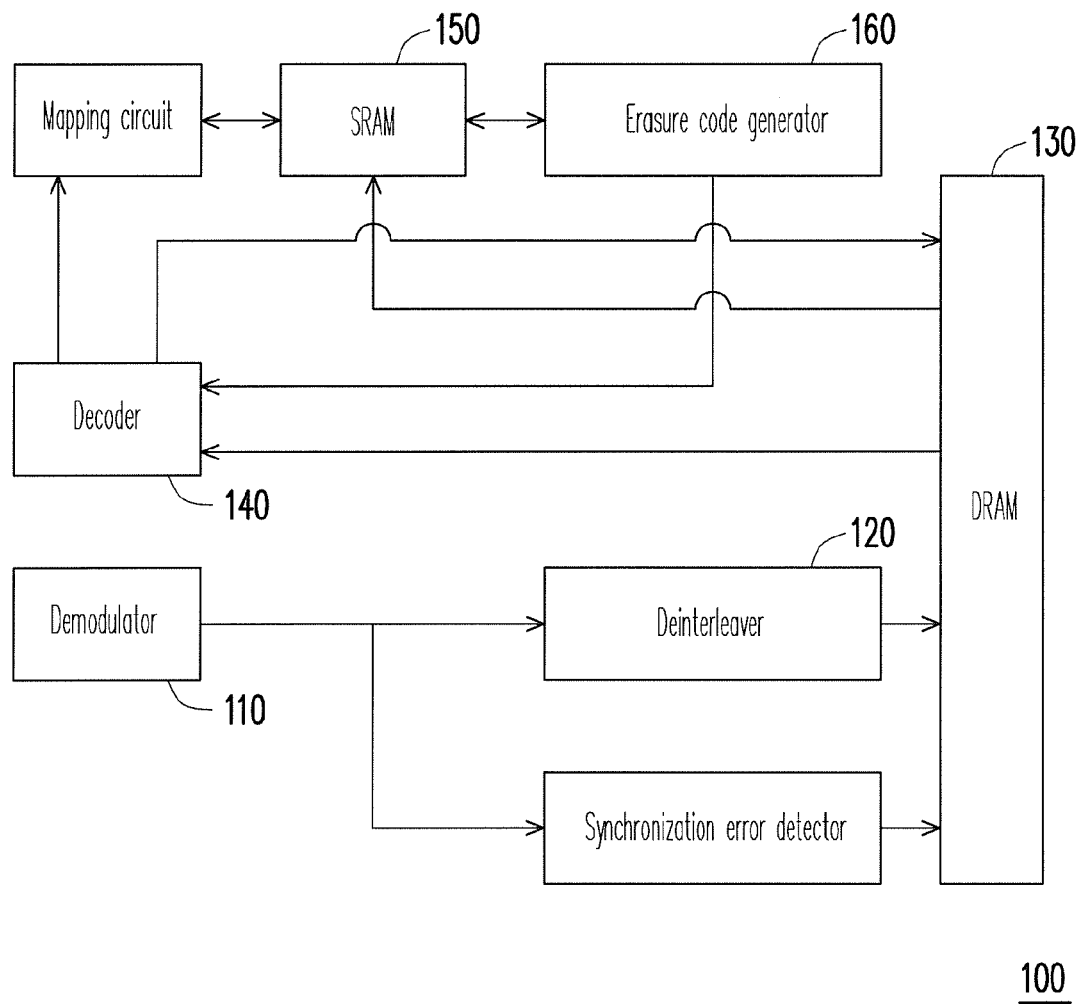
FIG. 1 shows a conventional data decoding apparatus for a high-density recording medium.

Reference will now be made in detail to the present embodiments of the invention, examples of which are illustrated in the accompanying drawings. Wherever possible, the same reference numbers are used in the drawings and the description to refer to the same or like parts.

A decoding apparatus for a high-density recording medium (i.e., the so-called BD) will be described below by embodiments with the accompanying drawings, such that those of ordinary skill in the art will better understand and implement the present invention accordingly.

Figure 2:
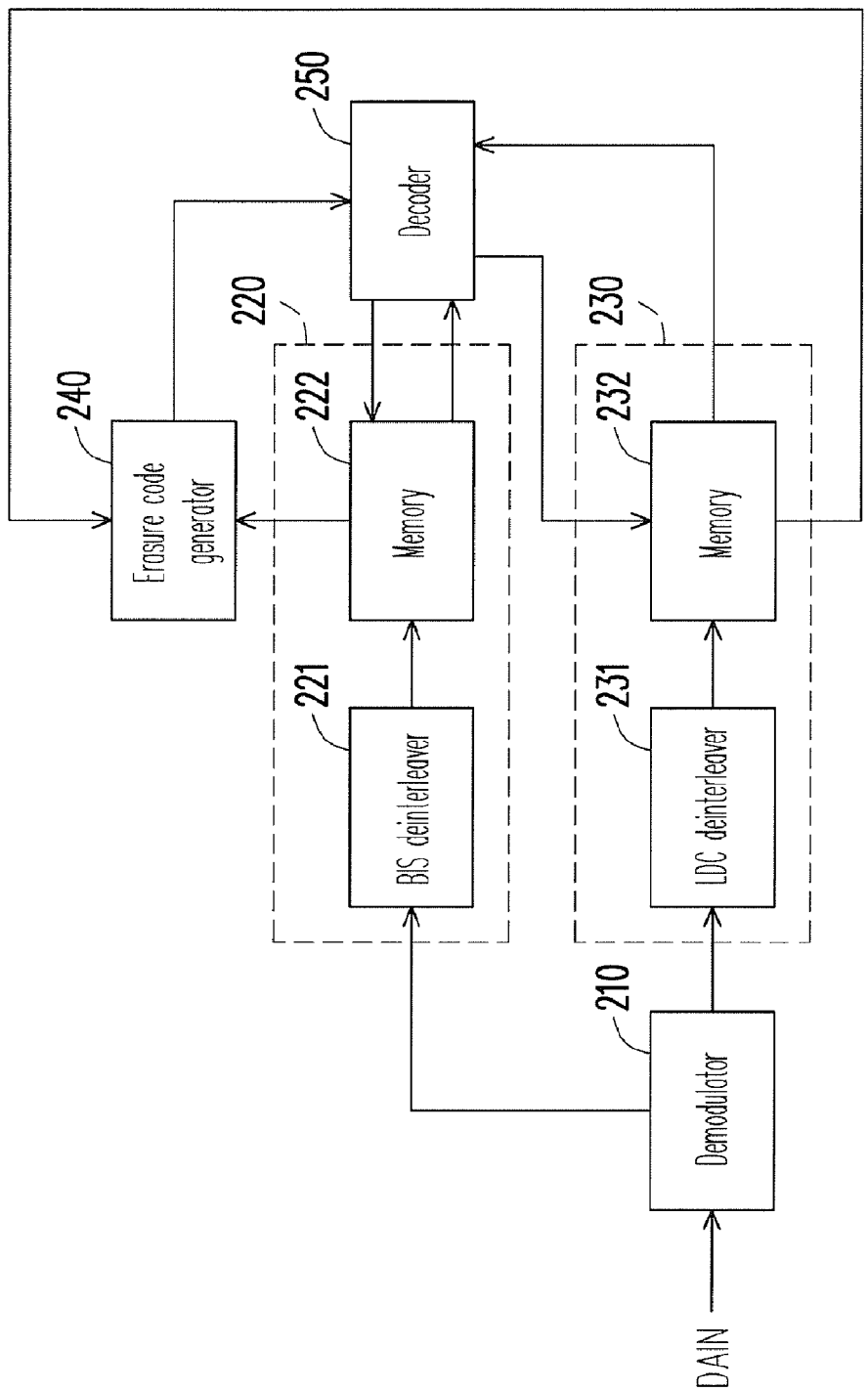
FIG. 2 is a schematic view of a decoding apparatus for a high-density recording medium according to an embodiment of the present invention.

FIG. 2 is a schematic view of a decoding apparatus according to an embodiment of the present invention. The decoding apparatus for a high-density recording medium 200 includes a demodulator 210, a BIS processing module 220, an LDC processing module 230, an erasure code generator 240, and a decoder 250. The demodulator 210 receives a data DAIN read from the high-density recording medium (not shown), and demodulates the data DAIN, so as to obtain a demodulated data and a demodulation error flag. The BIS processing module 220 and the LDC processing module 230 are coupled to the demodulator 210, for respectively receiving and deinterleaving the demodulated data. The BIS processing module 220 includes a BIS deinterleaver 221 and a memory 222 serially connected to each other. The BIS deinterleaver 221 receives and deinterleaves the demodulated data, so as to obtain a BIS data. The BIS processing module 220 stores the BIS data in the memory 222.

It should be noted that the data amount of a common BIS data is not too large, such that the memory 222 is usually an SRAM easy to be accessed.

The LDC processing module 230 includes an LDC deinterleaver 231 and a memory 232. The LDC deinterleaver 231 receives and deinterleaves the demodulated data, so as to obtain an LDC data. The LDC processing module 230 stores the LDC data in the memory 232 coupled to the LDC deinterleaver 231. Different from the BIS data, the data amount of the LDC data is usually much larger, such that the memory 232 is a DRAM with a relatively smaller circuit area. In addition, the memory 232 may also store the demodulation error flag generated during the demodulation.

The decoder 250 is coupled to the LDC processing module 230, the BIS processing module 220, and the erasure code generator 240, for respectively decoding the BIS data and the LDC data. The decoder 250 first reads and decodes the BIS data stored in the memory 222, and after decoding, records the position of the bit with an error as a so-called BIS error flag. Due to its small data amount, the BIS error flag will be stored in the SRAM 222.

After decoding the BIS data, the decoder 250 reads and decodes the LDC data from the memory 232. Meanwhile, the erasure code generator 240 reads the BIS error flag from the memory 222, and reads the demodulation error flag from the memory 232. The erasure code generator 240 sets an erasure flag corresponding to the LDC data according to the read demodulation error flag and the read BIS error flag, and provides the erasure flag to the decoder 250. The decoder 250 may decode the LDC data through the erasure flag, so as to improve the performance of decoding the LDC data.

It should be noted that in the decoding apparatus for a high-density recording medium 200, the memory 222 accesses the BIS error flag and the BIS data. In this manner, the access times of the DRAM 232 may be greatly reduced, so as to effectively prevent wasting the bandwidth of the DRAM. Further, the erasure flag is set according to the demodulation error flag and the BIS error flag, such that the setting is more precise.

The setting of the erasure flag will be illustrated below by a corresponding embodiment.

Figure 3:
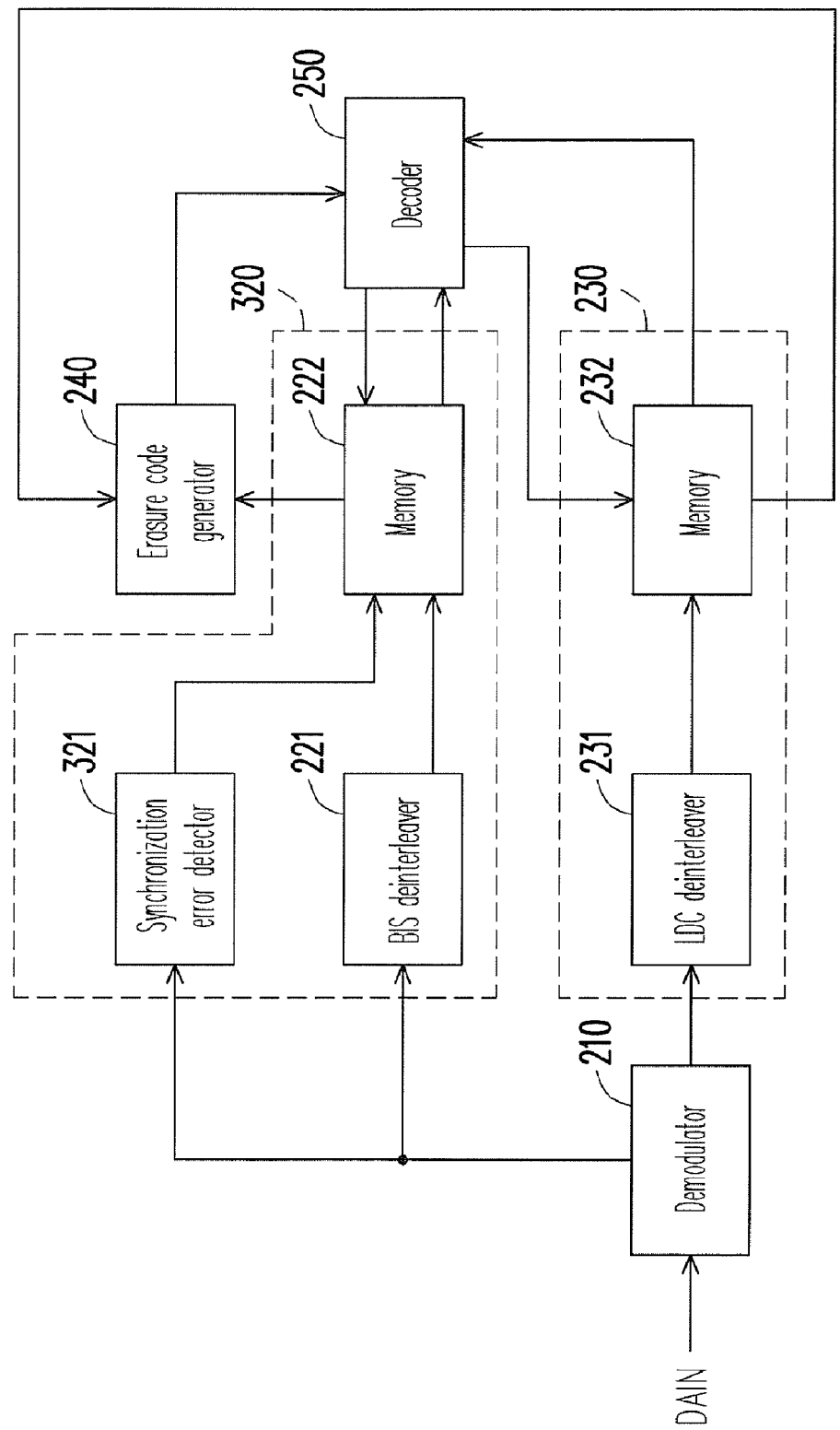
FIG. 3 shows another implementing manner of a BIS processing module according to an embodiment of the present invention.
Figure 4:
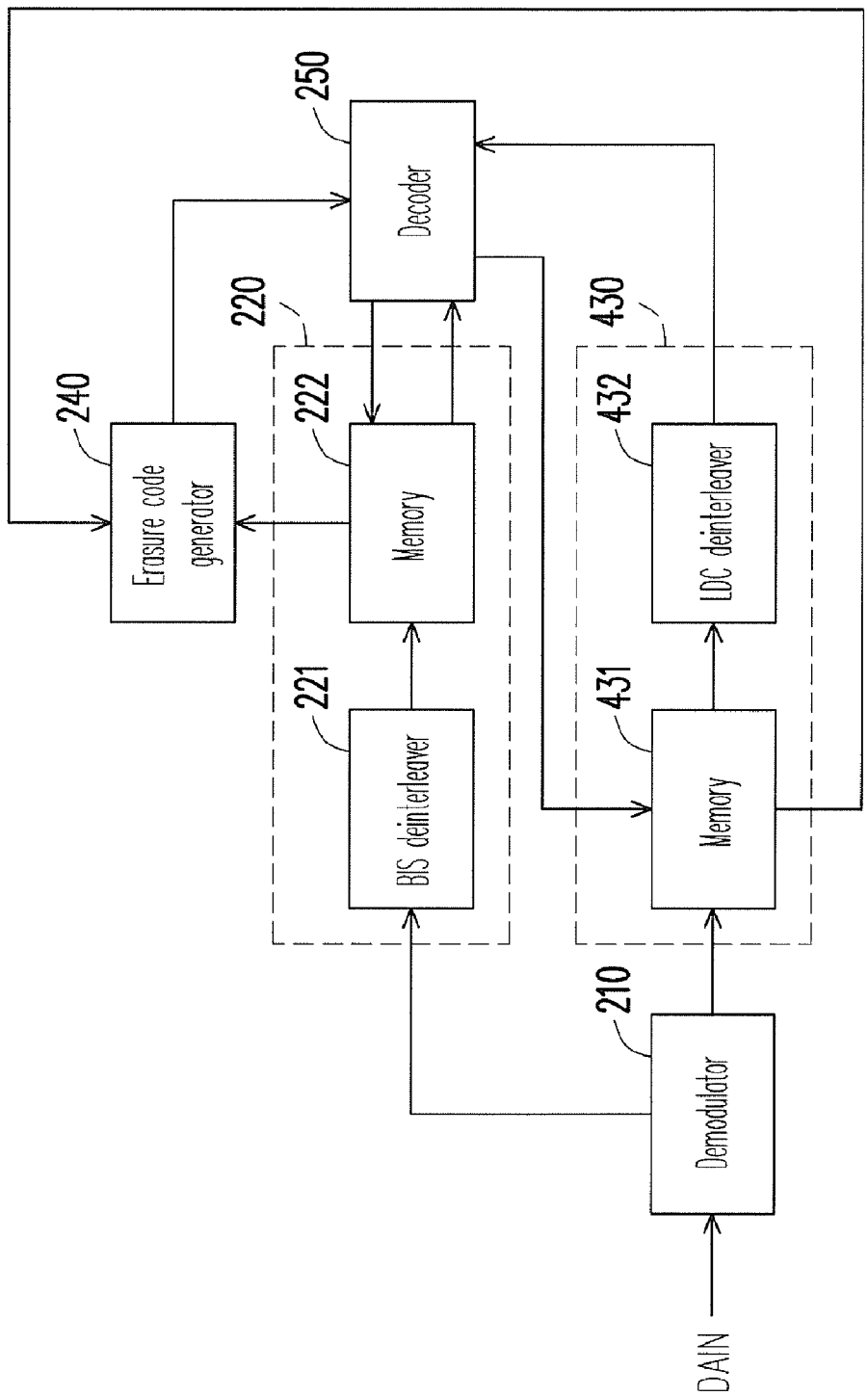
FIGS. 4 and 5 respectively show different implementing manners of an LDC processing module according to an embodiment of the present invention.
Figure 5:
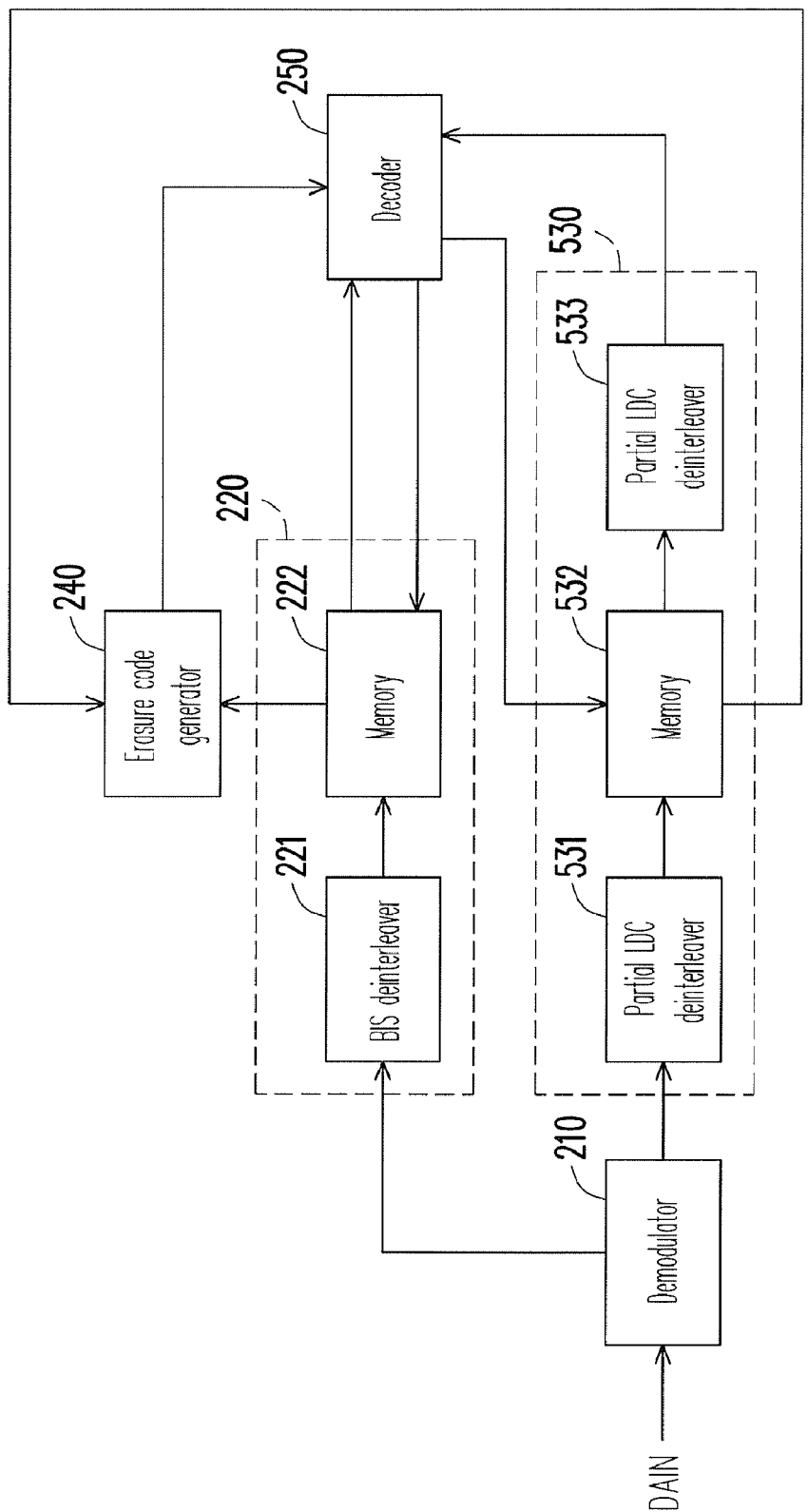

FIG. 3 shows another implementing manner of a BIS processing module according to an embodiment of the present invention. Different from the above BIS processing module 220, the BIS processing module 320 of a decoding apparatus for a high-density recording medium 300 further includes a synchronization error detector 321. The synchronization error detector 321 is coupled between the memory 222 and the demodulator 210, for detecting a synchronization error generated when the demodulator 210 demodulates the data DAIN and storing the synchronization error in the memory 222. FIGS. 4 and 5 respectively show different implementing manners of an LDC processing module according to an embodiment of the present invention. Referring to FIG. 4, a memory 431 of the LDC processing module 430 in a decoding apparatus for a high-density recording medium 400 is coupled between an LDC deinterleaver 432 and the demodulator 210. The LDC deinterleaver 432 is coupled between the memory 431 and the decoder 250. The LDC processing module 430 first stores the data generated by the demodulator 210 in the memory 431. When it intends to provide the LDC data to the decoder 250 for decoding, the LDC deinterleaver 432 reads and deinterleaves the data from the memory 431.

Next, referring to FIG. 5, the LDC processing module 530 of a decoding apparatus for a high-density recording medium 500 includes partial LDC deinterleavers 531, 533 and a memory 532. The partial LDC deinterleaver 531 is coupled to the demodulator 210, and the partial LDC deinterleaver 533 is coupled to the decoder 250. The memory 532 is serially connected between the partial LDC deinterleaver 531 and the partial LDC deinterleaver 533. The LDC processing module 530 performs a first deinterleaving on the demodulated data through the partial LDC deinterleaver 531, and performs a second deinterleaving on the incompletely deinterleaved LDC data through the partial LDC deinterleaver 533 when the LDC is provided to the decoder 250 for decoding.

Next, various implementation strategies are provided below to further illustrate the setting of the erasure flag by the erasure code generator.

FIG. 6 is a schematic view showing several strategies of setting an erasure flag by an erasure code generator according to an embodiment of the present invention. First, Strategy 1 is provided. On determining that BIS error flags BISF1 and BISF2 adjacent to an LDC data LDC2 are both 1, the erasure code generator sets the erasure flag corresponding to the LDC data LDC2 according to the demodulation error flag. During the demodulation process, errors may occur to some bits of the LDC data, such that "E" is set in the erasure flag, indicating the erasure of the corresponding bit in the LDC data LDC2 with the demodulation error.

Then, in Strategy 2, on determining that the BIS error flag BISF2 is 1, the erasure code generator sets the erasure flags corresponding to the LDC data LDC2 and LDC3 according to the demodulation error flags of the LDC data LDC2 and LDC3 adjacent to the BIS error flag BISF2. Moreover, in Strategy 3, the erasure code generator may also set the erasure flag corresponding to the LDC data LDC3 only according to the demodulation error of the LDC data LDC3 adjacent to the BIS error flag BISF2, and erase all the bits of the other LDC data LDC2 adjacent to the BIS error flag BISF2. In addition, "e" in the erasure flag of the LDC data LDC2 indicates that all the bits therein will be erased.

Next, in Strategy 4, on determining that the BIS error flags BISF1 and BISF2 adjacent to the LDC data LDC2 are both 1, the erasure code generator erases all the bits of the LDC data (the erasure flags are all set to be "e"), and on determining that only one of the BIS error flags BISF2 and BISF3 adjacent to the LDC data LDC3 is 1, the erasure code generator sets the erasure flag corresponding to the LDC data LDC3 according to the demodulation error flag of the LDC data LDC3 adjacent to the BIS error flag BISF2. In addition, the setting of the erasure flag of the LDC data LDC1 is the same as the setting of the erasure flag of the LDC data LDC3.

Moreover, Strategy 5 is a combined application of Strategies 1 and 3. In this strategy, the BIS error flags BISF2 and BISF3 adjacent to the LDC data LDC3 are both 1, so the erasure flag corresponding to the LDC data LDC3 is set according to the manner in Strategy 1. In addition, all the bits of the LDC data LDC2 and LDC4 are erased according to the manner in Strategy 3.

Here, it should be particularly noted that the aforementioned strategies of setting the erasure flag may be combined in practice, and are not limited to the manners described in Strategies 1 to 5. The settings of the erasure flag according to the BIS error flag and the demodulation error flag fall within the scope of the present invention.

To sum up, in the present invention, the LDC data and BIS data are simultaneously deinterleaved, so as to effectively shorten the time taken for deinterleaving the BIS data. Besides, the BIS error flag can be provided to the decoder in time for decoding the LDC data, thus improving the decoding efficiency. Further, in the present invention, the erasure flag is set according to the BIS error flag and the demodulation error flag, such that the setting is more precise. In addition, as the SRAM is employed to store the BIS error flag and the BIS data, the bandwidth of the DRAM will be saved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding apparatus for a high-density recording medium, comprising:
   a demodulator, for receiving and demodulating a data from the high-density recording medium, so as to obtain a demodulated data and a demodulation error flag;
   a long-distance code (LDC) processor, coupled to the demodulator, for deinterleaving the demodulated data to obtain an LDC data;
   a burst indicator subcode (BIS) processor, coupled to the demodulator, for deinterleaving the demodulated data to obtain a BIS data, and storing the BIS data and a BIS error flag;
   an erasure code generator, coupled to the LDC processor and the BIS processor, for setting an erasure flag corresponding to the LDC data according to the demodulation error flag and the BIS error flag; and
   a decoder, coupled to the LDC processor, the BIS processor, and the erasure code generator, for decoding the LDC data according to the erasure flag, and decoding the BIS data to obtain the BIS error flag,
   wherein the LDC processor and the BIS processor simultaneously deinterleave the demodulated data to obtain the LDC data and the BIS data respectively.

2. The decoding apparatus for a high-density recording medium according to claim 1, wherein the BIS processor comprises:
   a BIS deinterleaver, for receiving the demodulated data, and deinterleaving the demodulated data to obtain the BIS data; and
   a first memory, coupled to the BIS deinterleaver and the decoder, for storing the BIS data and the BIS error flag.

3. The decoding apparatus for a high-density recording medium according to claim 2, wherein the BIS processor further comprises:
   a synchronization error detector, coupled between the first memory and the demodulator, for detecting a synchronization error generated when the demodulator is in operation.

4. The decoding apparatus for a high-density recording medium according to claim 3, wherein the first memory further stores the synchronization error.

5. The decoding apparatus for a high-density recording medium according to claim 1, wherein the first memory is a static random access memory (SRAM).

6. The decoding apparatus for a high-density recording medium according to claim 1, wherein the LDC processor comprises:
   an LDC deinterleaver, coupled to the demodulator, for deinterleaving the demodulated data to obtain the LDC data; and
   a second memory, coupled between the LDC deinterleaver and the decoder, for storing the LDC data and the demodulation error flag.

7. The decoding apparatus for a high-density recording medium according to claim 6, wherein the second memory is a dynamic random access memory (DRAM).

8. The decoding apparatus for a high-density recording medium according to claim 1, wherein the LDC processor comprises:
   a second memory, coupled to the demodulator, for storing the demodulated data and the demodulation error flag; and
   an LDC deinterleaver, coupled between the second memory and the decoder, for deinterleaving the demodulated data to obtain the LDC data.

9. The decoding apparatus for a high-density recording medium according to claim 8, wherein the second memory is a DRAM.

10. The decoding apparatus for a high-density recording medium according to claim 1, wherein the LDC processor comprises:
    a first partial LDC deinterleaver, coupled to the demodulator, for performing a first deinterleaving on the demodulated data, and generating an incompletely deinterleaved LDC data;
    a second memory, coupled to the first partial LDC deinterleaver, for storing the incompletely deinterleaved LDC data and the demodulation error flag; and
    a second partial LDC deinterleaver, coupled between the second memory and the decoder, for performing a second deinterleaving on the incompletely deinterleaved LDC data to generate an LDC data.

11. The decoding apparatus for a high-density recording medium according to claim 10, wherein the second memory is a DRAM.

12. The decoding apparatus for a high-density recording medium according to claim 1, wherein on determining that the BIS error flag adjacent to the LDC data is 1, the erasure code generator sets the erasure flag corresponding to the LDC data according to the demodulation error flag.

13. The decoding apparatus for a high-density recording medium according to claim 1, wherein on determining that the BIS error flag is 1, the erasure code generator sets the erasure flag corresponding to the LDC data according to the demodulation error flag of the LDC data adjacent to the BIS error flag, or erases all the bits of the LDC data.

14. The decoding apparatus for a high-density recording medium according to claim 1, wherein on determining that both BIS error flags adjacent to the LDC data are 1, the erasure code generator erases all the bits of the LDC data, and on determining that only one BIS error flag adjacent to the LDC data is 1, the erasure code generator sets the erasure flag corresponding to the LDC data according to the demodulation error flag of the LDC data adjacent to the BIS error flag.

* * * * *